(12) United States Patent
Hubner

(10) Patent No.: US 7,356,055 B2
(45) Date of Patent: Apr. 8, 2008

(54) METHOD AND DEVICE FOR REGULATING THE AVERAGE WAVELENGTH OF A LASER, ESPECIALLY A SEMICONDUCTOR LASER

(75) Inventor: Bernd Hubner, Santa Clara, CA (US)

(73) Assignee: Finisar Corporation, Sunnyvale, CA (US)

(*) Notice: Subject to any disclaimer, the term of this patent is extended or adjusted under 35 U.S.C. 154(b) by 313 days.

(21) Appl. No.: 10/473,942

(22) PCT Filed: Apr. 12, 2002

(86) PCT No.: PCT/DE02/01380

§ 371 (c)(1),
(2), (4) Date: May 28, 2004

(87) PCT Pub. No.: WO02/084828

PCT Pub. Date: Oct. 24, 2002

(65) Prior Publication Data

US 2004/0190570 A1    Sep. 30, 2004

(30) Foreign Application Priority Data

Apr. 12, 2001   (DE) ................. 101 18 450
Oct. 1, 2001    (DE) ................. 101 55 331

(51) Int. Cl.
*H01S 3/13* (2006.01)
*H01S 3/00* (2006.01)

(52) U.S. Cl. ................. 372/29.02; 372/38.02

(58) Field of Classification Search ........... 372/20, 372/28, 29.02, 29.011, 32, 38.01, 38.02
See application file for complete search history.

(56) References Cited

U.S. PATENT DOCUMENTS 5,195,155 A   3/1993  Shimaoka et al.
(Continued)

FOREIGN PATENT DOCUMENTS

DE   2918100 C2   11/1980

DE   3875078 T2   2/1993

(Continued)

OTHER PUBLICATIONS

Article entitled "Broad Continuous Frequency Tuning of a Diode Laser with an External Cavity", by Oleg Kazharsky, Sergei Pakhomov, Alexander Grachev, Yuri Mironov, Igor Goncharov, Alexander Matveev; Elsevier Science B.V. Optics Communications 137, pp. 77-82, Apr. 15, 1997.

(Continued)

*Primary Examiner*—Armando Rodriguez
(74) *Attorney, Agent, or Firm*—Workman Nydegger

(57) ABSTRACT

The invention relates to a method for regulating the average wavelength of a laser, especially a semiconductor laser, comprising a wavelength-selective, at least partially reflecting optical element (27) and being operated in a unimodal manner. The inventive method involves the following steps: a control variable influencing the optical resonator length ($L_{opt}$) of the laser (29) over a pre-determined range is modified continuously or step-by-step; the characteristic of the optical monitoring power ($P_{mon}$) which is influenced in this way and emerges on the side opposite the optical output of the laser (29), or the characteristic of a detection variable dependent on the optical monitoring power, is detected continuously or step-by-step; and the control variable influencing the optical resonator length ($L_{opt}$) is regulated in such a way that a pre-defined value of the increase of the characteristic of the optical monitoring power ($P_{mon}$) or the characteristic of the detection variable dependent on the optical monitoring power, is reached in a point inside the control variable range, or a pre-defined value of a functional dependence ($F(dP_{mon}/dL_{opt})$) is reached, containing the increase of the characteristic of the optical monitoring power ($P_{mon}$) or of the characteristic of the detection variable dependent on the optical monitoring power. Furthermore, the invention relates to a device for carrying out the inventive method.

20 Claims, 5 Drawing Sheets

U.S. PATENT DOCUMENTS

Figure 1:
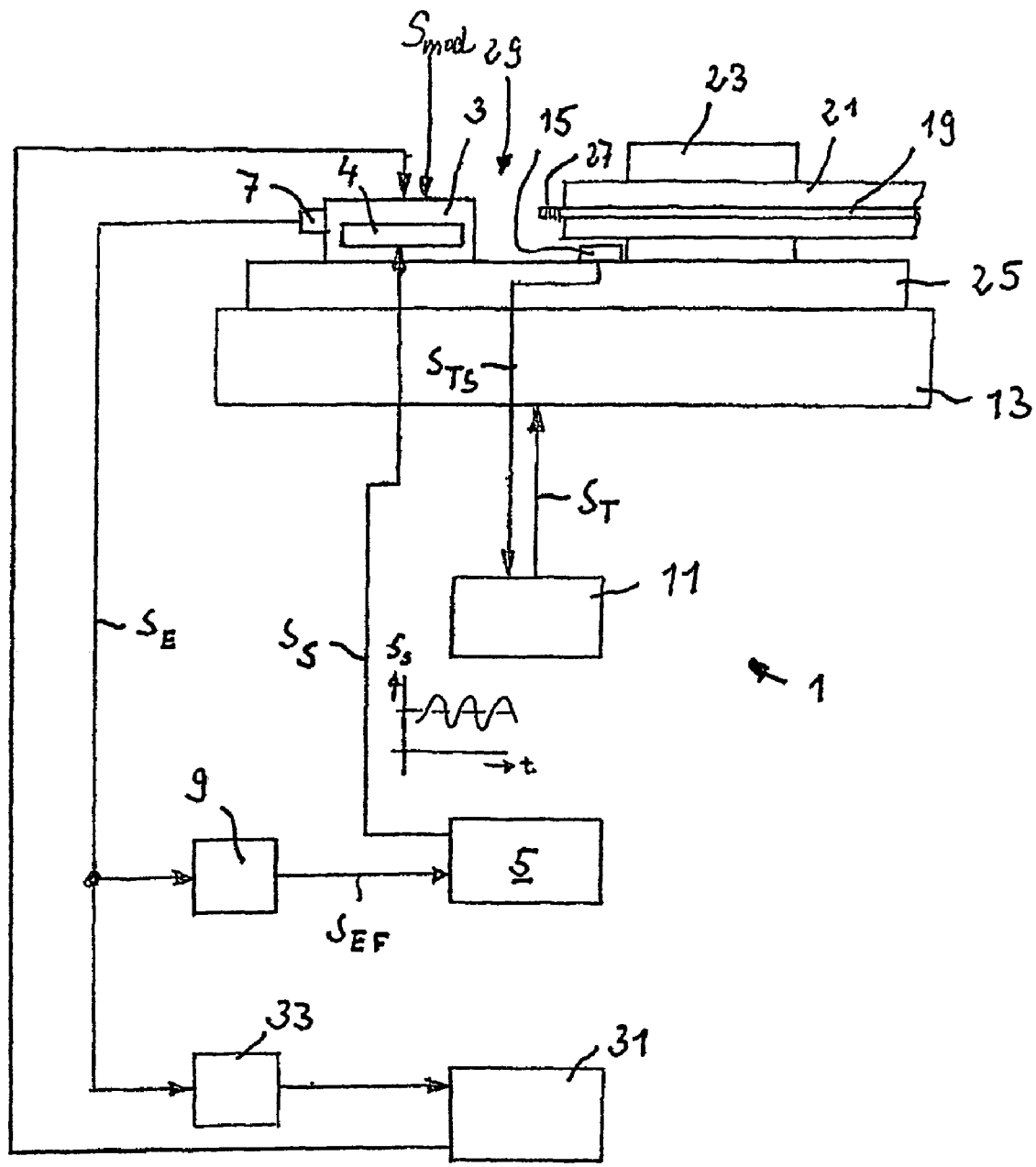

| | | | |
|---|---|---|---|
| 5,347,415 | A | 9/1994 | Murata et al. |
| 5,537,276 | A | 7/1996 | Mukae et al. |
| 5,832,014 | A * | 11/1998 | Johnson .................. 372/32 |
| 5,870,417 | A | 2/1999 | Verdiell et al. |
| 5,914,972 | A | 6/1999 | Siala et al. |
| 6,154,952 | A | 12/2000 | Tangren |
| 6,580,734 | B1 * | 6/2003 | Zimmermann ........... 372/29.02 |
| 2002/0021480 | A1 | 2/2002 | Auracher et al. |
| 2004/0141697 | A1 | 7/2004 | Hubner |

FOREIGN PATENT DOCUMENTS

| | | |
|---|---|---|
| DE | 19704502 | 2/1998 |
| DE | 19752028 C2 | 6/1999 |
| DE | 69415437 T2 | 6/1999 |
| DE | 19805849 | 9/1999 |
| DE | 10037975 | 2/2002 |
| DE | 02084357 | 10/2002 |
| DE | 02103417 | 12/2002 |
| EP | 0373225 | 6/1990 |
| EP | 0488658 | 6/1992 |
| EP | 0638895 | 2/1995 |
| EP | 1053576 | 11/2000 |
| EP | 1186927 | 3/2002 |
| JP | 57198415 | 12/1982 |
| JP | 59-087635 | 5/1984 |
| JP | 57013301 | 1/1998 |
| JP | 2000357309 | 12/2000 |
| WO | 0137019 | 5/2001 |
| WO | 0145094 | 6/2001 |

OTHER PUBLICATIONS

U.S. Appl. No. 10/473,940, Muller, (claims priority to 02084357 DE).

U.S. Appl. No. 10/473,941, Seitz, (claims priority to 02103417 DE).

* cited by examiner

METHOD AND DEVICE FOR REGULATING THE AVERAGE WAVELENGTH OF A LASER, ESPECIALLY A SEMICONDUCTOR LASER

The invention concerns a method and an apparatus for controlling the center wavelength of a laser, particularly semiconductor lasers, which is operated in a single-mode manner and which has on its output end a wavelength-selective, partially reflective optical element.

The method according to the invention or rather the apparatus according to the invention is applicable particularly in semiconductor lasers having an external resonator, which is implemented, for example, using a fiber grating which is integrated in the coupling end of a pigtail. The semiconductor laser can have a so-called taper laser structure in which the spot radius or rather the aperture angle of the radiated field is adapted to the corresponding parameters of the pigtail fiber.

In practice, particularly when used in wavelength division multiplex (WDM) systems, semiconductor lasers must be controlled in terms of their center wavelength. The center wavelength is dependent particularly on the temperature and the degradation of the semiconductor laser. With increasing degradation, the center wavelength of a semiconductor laser generally shifts in the direction of higher wavelengths.

In WDM systems, it is thus necessary to keep the center wavelength of a semiconductor laser constant by using a suitable closed-loop control circuit. Particularly the temperature of the laser chip is suitable as a control quantity for controlling the center wavelength, it being possible to adjust the temperature using a Peltier element, for example.

Known methods and apparatuses for controlling the center wavelength of a laser generally divert a small part of the optical output power from the optical output power of the laser and feed this part via a wavelength-selective optical filter. The power emitted through the filter is detected using a receiving diode, the optical power received by this monitor diode and thus the electrical output signal of the monitor diode changing correspondingly in response to a change in the center wavelength of the laser. By evaluating the monitor signal and tracking the control quantity, e.g., the electrical trigger quantity for the Peltier element, the center wavelength of the transmission spectrum of the laser can be maintained constant within the framework of a closed control loop. The degradation of the laser can thus be compensated for within certain limits.

A disadvantage of these known methods is the additional expense of the monitor diode and the optical filter.

The underlying object of the invention is therefore to create a method for controlling the center wavelength of a laser, particularly semiconductor lasers, which has a wavelength-selective, at least partially reflective optical element and which is operated in a single-mode manner, which method can be implemented at a low cost and which guarantees that the center wavelength of the laser is held constant within the required tolerances. Moreover, the underlying object of the invention is to create an apparatus to carry out a method of this sort.

The invention is based on the insight that in lasers that are operated in a single-mode manner, particularly semiconductor lasers with external resonators, e.g., in the form of fiber gratings, the optical power emitted through the rear mirror which can be detected by a monitor diode is highly dependent on the optical length of the resonator. Lasers of this sort exhibit the necessary narrow bandwidth of the transmission spectrum in order to be suitable for use in dense-wavelength division multiplex (DWDM) systems. Here, the optical monitor power which is emitted through the rear output of the laser and thus the signal of the monitor diode of the laser exhibit a periodicity of $n \cdot \lambda_0/2$, where n is the effective refractive index of the optical path within the resonator and $\lambda_0$ the center wavelength of the laser.

The maximum of the curve of the optical output power $P_{mon}$ on the rear output of the laser as a function of the optical length $L_{opt}$ of the resonator has a maximum at the point at which optimum suppression of the neighboring (side) modes also occurs.

According to the invention, the curve of the optical output power on the rear output of the laser or rather a corresponding detection quantity can thus be used to control the center wavelength of the laser and to compensate in this manner particularly the disadvantageous effect of the degradation of the laser. For this purpose, a control quantity which influences the optical resonator length $L_{opt}$ of the laser is varied continuously or stepwise over a predetermined range. The optical monitor power $P_{mon}$ emitted through the rear output of the laser or a detection quantity dependent thereupon is detected continuously or stepwise. Based on the curve of the optical monitor power $P_{mon}$ or based on the detection quantity's curve, the slope of the curve can then be determined at one or more points within the predetermined range. The control quantity can then be adjusted such that a predetermined value of the slope of the curve of the optical monitor power $P_{mon}$ or of the detection quantity's curve is obtained. In this manner, a specified desired value for the optical monitor power or rather the detection quantity can be set, this desired value corresponding to a specified center wavelength $\lambda_0$ of the laser. Instead of the slope, a functional dependency can also be used into which the slope enters.

For example, in a tuning procedure or calibration procedure for a laser, a relatively wide range or the entire possible range for the control quantity can be passed through and the corresponding curve of the detection quantity recorded. The nominal center wavelength of the laser $\lambda_{0,Nominal}$ can be set in this manner very quickly and directly without suffering the disruptive effect associated with the long settling behavior of a corresponding control operation. For this purpose, only the slope of the detection quantity's curve must be known at that point of the curve at which the output spectrum of the laser exhibits the desired center wavelength $\lambda_{0,Nominal}$.

This slope can be determined once for each specimen of such a laser. Assuming suitably low manufacturing tolerances, it can also be sufficient to determine the relevant slope of the detection quantity for an entire batch of jointly manufactured lasers or for a certain type of laser structure just once.

According to the preferred embodiment of the invention, the detection quantity dependent on the optical monitor power $P_{mon}$ is formed by the output signal of a monitor diode which is already present and which is normally required anyway for controlling the operating point of the laser.

The method described above for controlling the center wavelength of a laser can of course be used within the framework of a single tuning or initialization procedure and can also be performed at predetermined intervals of time.

A heating or cooling device for a laser element encompassed by the entire laser is particularly suitable as a device which influences the optical resonator length $L_{opt}$ of the laser. The heating or cooling device can be implemented as a pure heating device, e.g., in the form of a heating resistor.

Moreover, it would also be possible to modify the axial position of the wavelength-selective, partially [partially reflective] optical element by means of a suitable adjustment device, e.g., a piezo-element.

In a further embodiment, the optical resonator length $L_{opt}$ of the laser can be adjusted using a device which changes the mechanical tension conditions within at least a subrange of the laser, e.g., within the wavelength-selective, at least partially reflective optical element.

According to a preferred embodiment of the invention, the optical characteristics of the partially reflective wavelength-selective optical element are kept constant. In particular, the temperature of the element which affects its optical characteristics can be kept constant for this purpose.

To ensure essentially continuous control of the center wavelength $\lambda_0$ of the optical data output power of the laser, the control quantity influencing the optical resonator length $L_{opt}$ of the laser can be periodically modified. For example, the temperature of the laser can be varied through suitable triggering of a heating or cooling device for a laser element encompassed by the laser with a period ranging up to several hundred hertz. The width of the range which is passed through when varying the control quantity must be chosen so that the associated change in the center wavelength $\lambda_0$ of the optical data output power of the laser lies within predetermined acceptable boundaries.

Following each pass through the range for the control quantity (in one direction), the slope of the curve of the optical monitor power $P_{mon}$ or rather the slope of the curve of the relevant detection quantity can be determined at a point of the range for the control quantity which is specified relative to the limits of the range. For example, in each case for the value in the center between the range limits of the range for the control quantity, the slope of the detection quantity's curve can be determined. By comparing the value for the slope of the detection quantity at this point with the desired value for the slope of the detection quantity, the position of the range for the control quantity can then be modified such that the predetermined value for the slope of the detection quantity's curve is achieved. The amount and the direction by which the range for the control quantity is to be shifted after each step can be determined according to a predetermined control algorithm.

Instead of determining the slope at a point within the limits of the range for the detection quantity, the average slope of the detection quantity's curve in the entire range or within a subrange can also be determined.

Moreover, of course the detection quantity's curve can also be determined by forming a corresponding average value in a multiple pass through the range (in one direction or in both directions) instead of determining the relevant slope after each pass through the range for the control quantity.

According to the preferred embodiment of the invention, the control quantity influencing the optical resonator length $L_{opt}$ of the laser is varied such that the spectral component generated in this manner in the entire spectrum of the optical monitor power lies outside of the frequency range of the optical data signal which is generated by driving the laser with a corresponding electrical modulation signal. For this purpose, the control quantity can be varied sinusoidally, assuming a linear dependency of the optical resonator length on the control quantity, in order to generate the most narrowband spectrum in the data signal that is possible. In case of a non-linear dependency of the optical resonator length on the control quantity, the curve shape of the periodic control quantity can be chosen so that a sinusoidal change in the optical resonator length over time is obtained.

Since the optical output power of the laser in the range of the maximum of the curve of the monitor power $P_{mon}$ exhibits only a relatively low dependency on the optical resonator length, the optical output power $P_{mon}$ of the laser is modified only slightly, however, even for a relatively large amplitude of the control quantity,. In practical terms, however, the amplitude of the control quantity is limited by the fact that the center wavelength must be kept constant within a predetermined range.

The preferred embodiment of the apparatus according to the invention includes an evaluation and control unit, which can be implemented, for example, as a microprocessor unit to which the preferably bandpass-filtered signal of the detection quantity is fed and which generates in the manner described above the triggering signal for a device for changing the optical resonator length $L_{opt}$ of the laser. Insofar as the detection signal does not contain any other extraneous components besides a constant component (which defines the operating point of the laser) below the frequency at which the control signal is generated, a lowpass filter having a corresponding cutoff frequency can also be used instead of a bandpass filter.

If the apparatus includes in the conventional manner a control unit for the operating point of the laser, the detection signal must be fed to this control unit via a lowpass filter whose cutoff frequency is lower than the frequency at which the periodic control signal is generated.

Further embodiments of the invention follow from the dependent claims.

Figure 2:
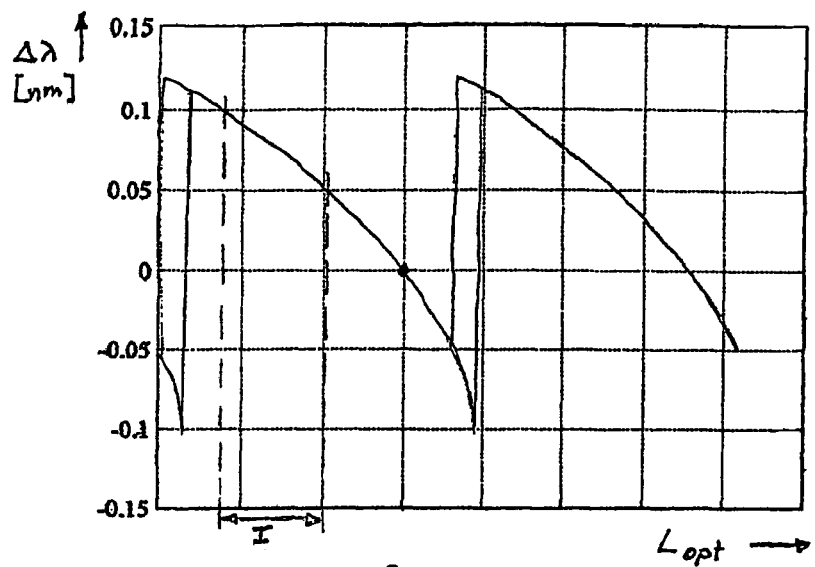
Figure 3:
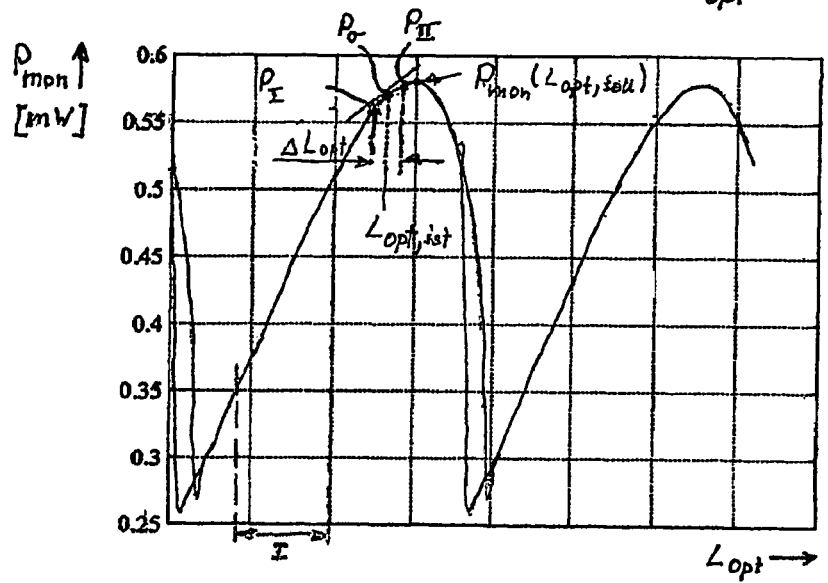
Figure 4:
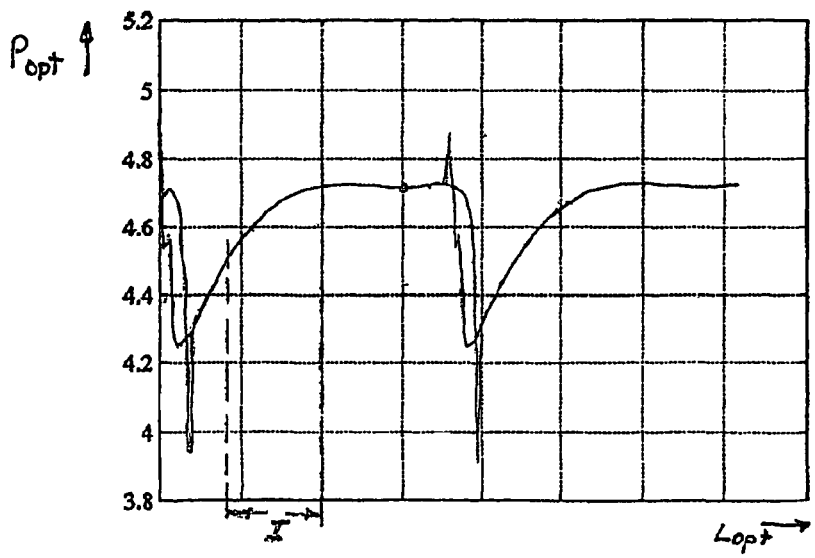
Figure 5:
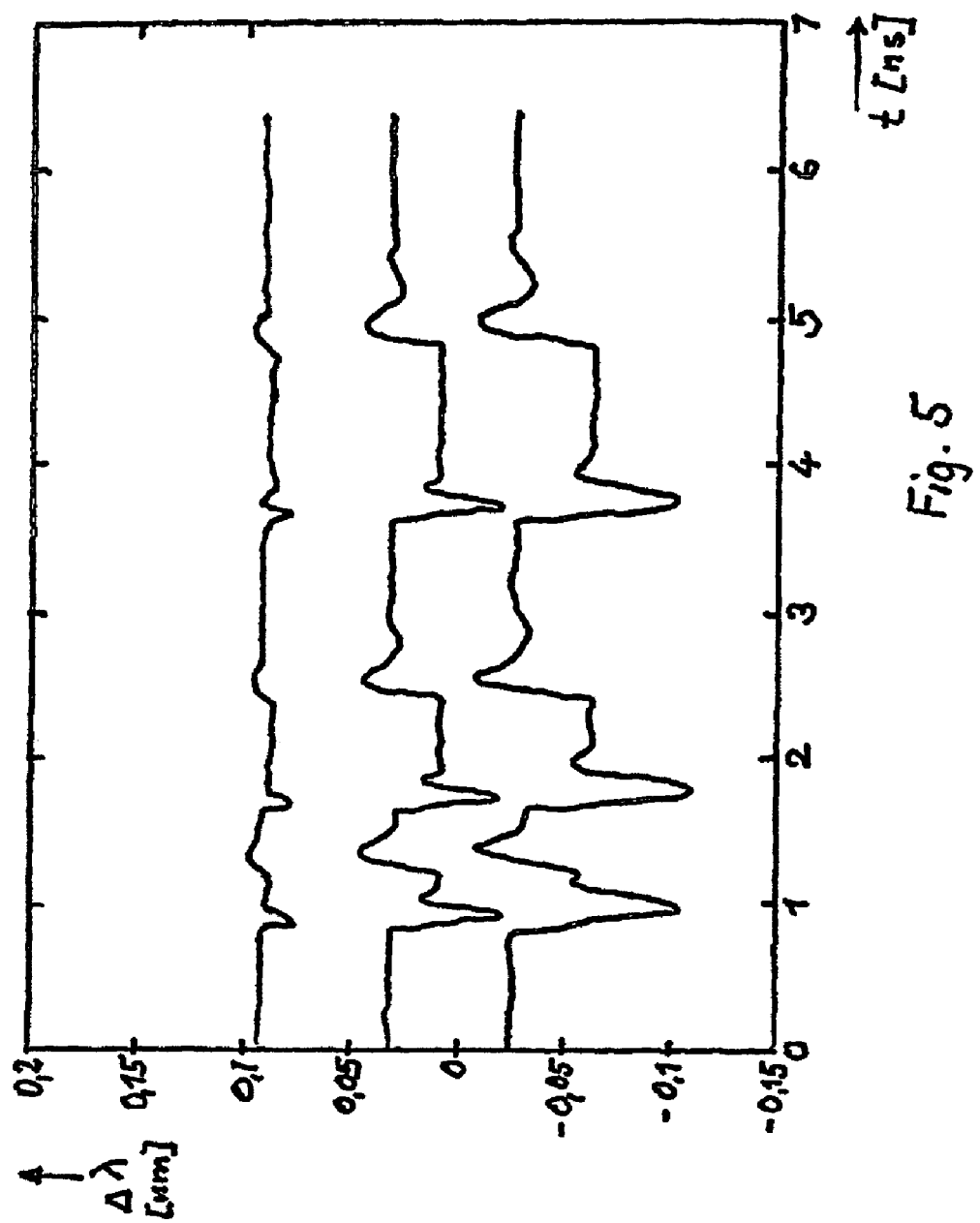
Figure 6:
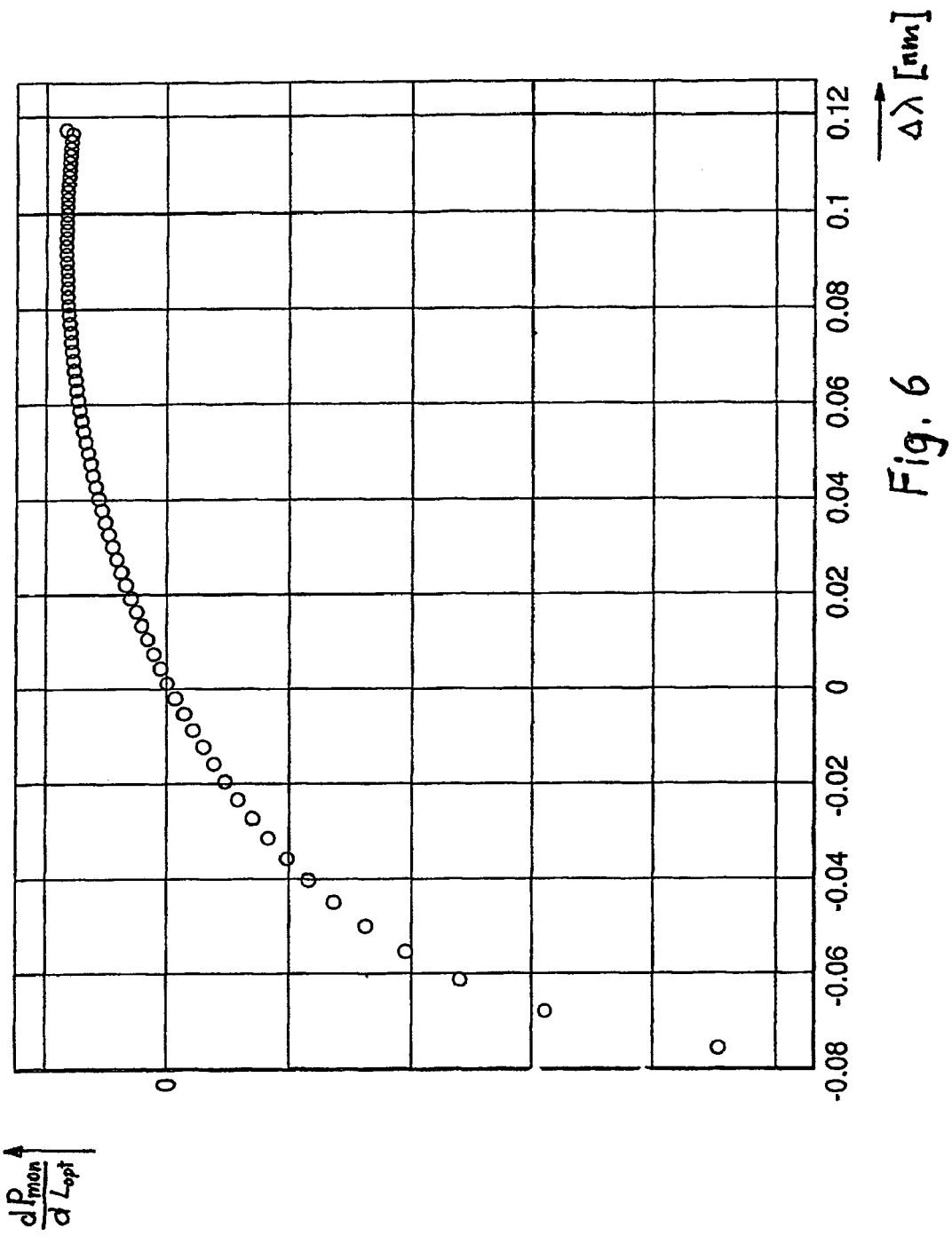

The invention is described hereafter based on an exemplary embodiment shown in the figures. The figures are as follows:

FIG. 1: A schematic block diagram of an apparatus for controlling the center wavelength of a laser according to the invention;

FIG. 2: A chart showing an exemplary curve of the deviation $\Delta\lambda = \lambda_0 - \lambda_{0,Nominal}$ of the actual center wavelength $\lambda_0$ from a desired value $\lambda_{0,Nominal}$ as a function of the optical length $L_{opt}$ of the resonator of a laser;

FIG. 3: A chart with a curve of the optical monitor power $P_{mon}$ at the rear output of the laser as a function of the optical length $L_{opt}$ of the resonator of the laser;

FIG. 4: A chart with a curve of the optical data output power $P_{opt}$ of the laser as a function of the optical length $L_{opt}$ of the resonator of the laser;

FIG. 5: A chart illustrating the chirp behavior of a fiber grating laser modulated at high bit rates;

FIG. 6: A chart illustrating the dependency of the slope of the optical monitor power for a change in the optical resonator length $L_{opt}$ on the difference between the transmit wavelength and the Bragg wavelength of the grating of the fiber grating laser; and FIG. 7: A chart illustrating the dependency of the slope of the optical monitor power referred to the absolute value of the optical monitor power $P_{mon}$ for a change in the optical resonator length $L_{opt}$ on the difference between the transmit wavelength and the Bragg wavelength of the grating of the fiber grating laser.

The apparatus 1 shown schematically in FIG. 1 as a block diagram for controlling the center wavelength of a laser 29 consists of a laser element 3 and an external resonator 27 and includes an evaluation and control unit 5 to which the detection signal $S_E$ of a monitor diode 7 of the laser element 3 is fed. In the shown embodiment, the laser element 3 is a semiconductor laser, preferably a laser with a taper structure. The monitor diode 7 is preferably formed integrated with the laser element 3.

The feeding of the detection signal $S_E$ to the evaluation and control unit 5 takes place via an (electrical) filter 9, which can be formed as a bandpass or lowpass filter. The filtered detection signal $S_{EF}$ is thus fed to the evaluation and control unit 5. The evaluation and control unit 5 can process the filtered detection signal $S_{EF}$ using either a digital or analog technique and generate a digital or analog control signal $S_S$. In the shown embodiment, the control signal $S_S$ is a control signal for controlling the temperature T of the laser element 3.

To control the temperature of the laser element 3, a heating or cooling device 4 is provided directly on the laser element, which heating or cooling device 4 can be formed as a pure heating unit in the form of a heating resistor. With the heating or cooling device 4, the phase of the laser element 3 or rather the optical resonator length of the laser element and thus also the optical resonator length of the $L_{opt}$ of the entire laser 29 can thus be influenced. Since the temperature of the external resonator can be kept constant in the manner described hereafter, the center wavelength of the external resonator can serve as a reference which can be kept constant through stabilization of the temperature of the external resonator within relatively narrow limits (e.g., with deviations smaller than 0.1 K) over the entire lifespan of the laser 29.

The heating or cooling unit 4 can also include a temperature sensor for detecting the temperature of the laser element 3 (not shown), which can be fed to the evaluation and control unit. In this manner, using the evaluation and control unit 5 it is also possible to implement the control of the temperature in the form of a closed control loop.

In order to control the temperature T of the entire laser 29, a temperature control unit 11 is provided which generates a triggering signal $S_T$ for a heating or cooling unit 13. To detect the temperature of the entire laser 29, a temperature sensor 15 is provided whose output signal $S_{TS}$ is fed to the temperature control unit 11. The temperature control unit 11 compares the signal $S_{TS}$ fed to it with a specified desired value for the temperature, e.g., stored in the temperature control unit 11 and generates the triggering signal $S_T$ such that the heating or cooling unit 13 maintains the nominal temperature with suitable accuracy. The temperature sensor 15 is arranged preferably in the immediate vicinity of the external resonator 27 so that its temperature is kept constant at the desired value. Additionally, the center wavelength of the laser 29 can be influenced, i.e., shifted or set to a desired value, within specific limits through a suitable choice of the desired value of the temperature which is generated using the heating or cooling unit 13, in other words by changing the reference formed by the external resonator 27.

If the heating or cooling unit 4 is formed as a pure heating device, the temperature of the laser element 3 will always be greater than or equal to the temperature of the other components of the laser 29 as a result.

As is shown schematically in FIG. 1, the control signal $S_S$ for the heating or cooling unit 4 can fluctuate sinusoidally with a predetermined frequency around an average value. This results in an essentially sinusoidally fluctuating temperature for the laser element 3.

The optical output power $P_{opt}$ of the laser element 3 is coupled into the end of an optical waveguide 19 which can be formed as a pigtail. As is shown in FIG. 1, the end of the optical waveguide 19 can be held in a sleeve 21 consisting of, for example, glass which sleeve is fastened using a fastening element 23 on a common support plate 25 on which the laser element 3 is also mounted. This results in a design which provides temperature stability and mechanical stability for the laser element 3 and the sleeve 21 held in the fastening element 23 with the optical waveguide 19. Of course, however, the end of the optical waveguide 19 can also be held and fastened in another manner, e.g., in a V groove in a corresponding support element.

In the front end region of the optical waveguide 19, a fiber grating is inscribed, which forms the external resonator 27 for the laser element 3 which is formed preferably as a taper laser. The center wavelength of the laser 29 which is formed by the laser element 3, the fiber grating 27 and the optical path lying between the two elements is adjustable using the triggering signal $S_T$ for the heating or cooling unit 4, as was previously explained.

The functioning of apparatus 1 is explained in greater detail hereafter based on the charts in FIGS. 2 to 4.

FIG. 2 shows the curve of the wavelength deviation $\Delta\lambda = \lambda_0 - \lambda_{0,Nominal}$ of the actual center wavelength $\lambda_0$ from a desired value of $\lambda_{0,Nominal}$ for the center wavelength as a function of the optical resonator length $L_{opt}$ of the laser 29. The wavelength deviation $\Delta\lambda$ is plotted on the ordinate in nm. It should be mentioned here that for the curves determined through simulation and shown in FIGS. 2 to 4, the temperature of the external resonator was assumed to be constant.

FIG. 3 shows the optical output power $P_{mon}$ at the rear end of the laser 29 or rather the laser element 3 which is detected by the monitor diode 7. During single-mode operation of the laser 29, the maximum of the monitor power $P_{mon}$ occurs at the point which can be defined, for example, as the desired value for the center wavelength.

Finally, FIG. 4 shows the optical output power $P_{opt}$ of the laser 29 as a function of the optical resonator length $L_{opt}$ of the laser 29. As can be seen in FIG. 4, the optical output power $P_{opt}$ in the range of the desired value $\lambda_{0,Nominal}$ for the center wavelength exhibits only a relatively small dependency on the optical resonator length.

Of course, all of the curves in FIGS. 2 to 4 exhibit a periodicity having a period of $n \cdot \lambda_0/2$, where n is used to designate the effective refractive index in the entire path of the resonator of the laser 29.

In order to continuously control the position of the center wavelength $\lambda_0$ of the laser 29, it is thus possible to vary the control signal $S_T$ periodically, e.g., sinusoidally (as shown in FIG. 1). The filtered detection signal $S_{EF}$ of the monitor diode 7 which is fed to the evaluation and control unit 5 thus varies periodically within a range of the curve shown in FIG. 3 for the optical monitor power $P_{mon}$. Here, a proportionality between the output signal $S_E$ of the monitor diode 7 and the optical monitor power $P_{mon}$ is assumed.

The limits of the periodically passed through range of the curve shown in FIG. 3 are designated as $P_I = P_{mon}(L_{opt,I})$ or rather $P_{II} = P_{mon}(L_{opt,II})$.

The evaluation and control unit 5 detects the periodically varying curve of the filtered signal $S_{EF}$ and determines the slope of the detected curve at a point $P_0 = P_{mon}(L_{opt,Actual})$ within the range passed through by the control signal $S_S$. This point can be chosen, for example, as the point in the center of the range passed through by the control signal $S_S$.

For the sake of simplicity, the range for the control signal and the detection signal are plotted in FIG. 3 based on the curve for the optical monitor power $P_{mon}$ as a function of the optical resonator length $L_{opt}$. Even if in practical terms the optical resonator length $L_{opt}$ is not a linear function of the temperature of the heating or cooling unit 4 and thus the control signal $S_S$, this should suffice to explain the method according to the invention. The point shown in FIG. 3 of the optical monitor power $P_{mon}(L_{opt,Actual})$ thus corresponds to the relevant point in the curve of the filtered detection signal $S_{EF}$ as a function of the control signal.

If the evaluation and control unit determines that the determined slope does not agree with the specified desired value for the slope, then the evaluation and control unit can modify the control signal $S_S$ such that the position of the range periodically passed through by the control signal is modified until the actually determined slope corresponds to the predetermined slope and thus the actual center wavelength $\lambda_0$ corresponds to the nominal center wavelength $\lambda_{0,Nominal}$.

Instead of determining the slope at a single point within the range passed through by the control signal $S_S$, an average slope in the entire detected curve of the detection signal $S_{EF}$ or a subrange thereof can also be determined of course.

The determination of the slope can take place after each pass through the range of the control signal $S_S$ or also after forming an average curve in case of a multiple pass through the range. Since the curves shown in FIGS. 2 to 4 exhibit hysteresis due to non-linearities, in each case an average value of the curve can also be formed while passing through the range for the control signal $S_S$ in different directions in each case.

The continuous control method described above can also be supplemented and/or replaced by the method explained hereafter which, however, is suited in particular as a tuning or initialization method for the laser.

Instead of periodically passing through just a relatively small range for the control signal $S_S$, a relatively large range for the control signal $S_S$ can be passed through one or more times and the corresponding detection signal $S_{EF}$ detected. This large range for the control signal $S_S$ must be so large that it is ensured that at least in the functional state of the laser 29, the point is reached at which the laser 29 reaches the nominal center wavelength $\lambda_{0,Nominal}$. After recording the corresponding curve for the detection signal $S_{EF}$, in this case that value within the passed through range for the control signal $S_S$ can be determined in that the detected curve for the detection signal $S_{EF}$ exhibits the desired slope. The relevant value for the control signal $S_S$ can then be set without any further delay, i.e., without the settling time associated with the previously described continuous control method.

To carry out the two methods described above, the triggering and control unit 5 needs only to know the value of the slope of the curve for the detection signal $S_{EF}$ at which the laser 29 reaches the desired nominal center wavelength $\lambda_{0,Nominal}$. This value can be determined once for a specific specimen of the laser 29 or rather the apparatus 1 or—assuming low manufacturing tolerances—for a certain batch of jointly manufactured lasers or rather apparatuses or for a certain type of a laser 29 or rather an apparatus 1.

Apparatus 1 shown in FIG. 1 includes moreover an operating point control unit 31 for the laser element 3. The operating point control unit 31 is fed the detection signal $S_E$ of the monitor diode 7 via a lowpass filter 33 whose cutoff frequency is chosen to be low enough so that the operating point control unit 31 is fed only the constant component of the signal $S_E$. The operating point control unit 31 controls the laser element 3 in the conventional manner, the laser element 3 having a suitable DC current applied to it. In addition to this control signal, the laser element 3 is fed the modulation signal $S_{mod}$.

Finally, it should be noted that instead of using a heating or cooling unit 4 for the laser element 4 [3], the optical length $L_{opt}$ of the laser 29 can also be modified in another manner, e.g., by using a shifting device for the front end of the optical waveguide 19 with respect to the distance from the front side of the laser element 3 facing it.

Moreover, the holding constant of the optical characteristics of the external resonator could be dispensed with. In this case, the heating or cooling unit 4 for the laser element 3 can be dispensed with. Instead, the heating or cooling unit 13 for the entire laser can be triggered so that suitable displacements of the center wavelength of the laser 29 occur. Due to the fluctuations of the optical characteristics of the reference, i.e., the external resonator, however, this method can be more problematic under certain circumstances.

Although for CW lasers or lasers modulated only at low bit rates, operation is possible with no further ado with an operating point with regard to the transmitted wavelength at which the optical monitor power $P_{mon}$ is at its maximum, i.e., at the point $P_{mon}(L_{opt,Nominal})$ in FIG. 3, and also the optical output power $P_{mon}$ of the laser lies in the maximum range (cf., FIG. 4), this is undesirable for lasers modulated at high bit rates, particularly fiber grating lasers (FGL). The reason is that the chirp behavior must be considered with such lasers. The closer the operating point with regard to the transmission wavelength lies to that value for the optical resonator length $L_{opt}$ at which mode hopping for the first side mode occurs (see the discontinuity in the center of FIG. 2), the worse the chirp behavior of the laser will become. This behavior is illustrated in FIG. 5. The three curves vs. time of the center wavelength of the output signal exhibit greater fluctuations of the center wavelength $\lambda$ (shown as $\Delta\lambda=\lambda-\lambda_{bragg}$), the smaller $\Delta\lambda$ is (taking into account the sign). It should be noted here that in the representation according to FIGS. 2 to 4, the Bragg wavelength $\lambda_{bragg}$ which results with the respectively used grating of the FGL corresponds to the wavelength $\lambda_{0,Nominal}$.

In these cases, it is thus advantageous to select the operating point with regard to the wavelength through suitable control of the optical resonator length $L_{opt}$ in a range in which $\Delta\lambda=\lambda-\lambda_{bragg}$ is sufficiently positive, e.g., in the range designated with I in FIGS. 2 to 4, which corresponds to a corresponding range for $\Delta\lambda$ (in the given example, approx. 0.05 nm<=$\Delta\lambda$<=0.1 nm).

If, as was explained above, only the slope of the optical monitor power $P_{mon}$ is evaluated to control the operating point, however, the problem arises in this case that the slope of the curve of $P_{mon}$ which is dependent on the optical resonator length changes in this range only to a very small extent.

FIG. 6 shows the dependency of the slope $dP_{mon}/dL_{opt}$ as a function of $\Delta\lambda=\lambda-\lambda_{bragg}$. Here, it is clear that in the range of interest I for the operation of the FGL e.g., 0.05 nm<=$\Delta\lambda$<=0.1 nm), there is hardly a change of the slope which is acceptable in practical terms for controlling the operating point.

Figure 7:
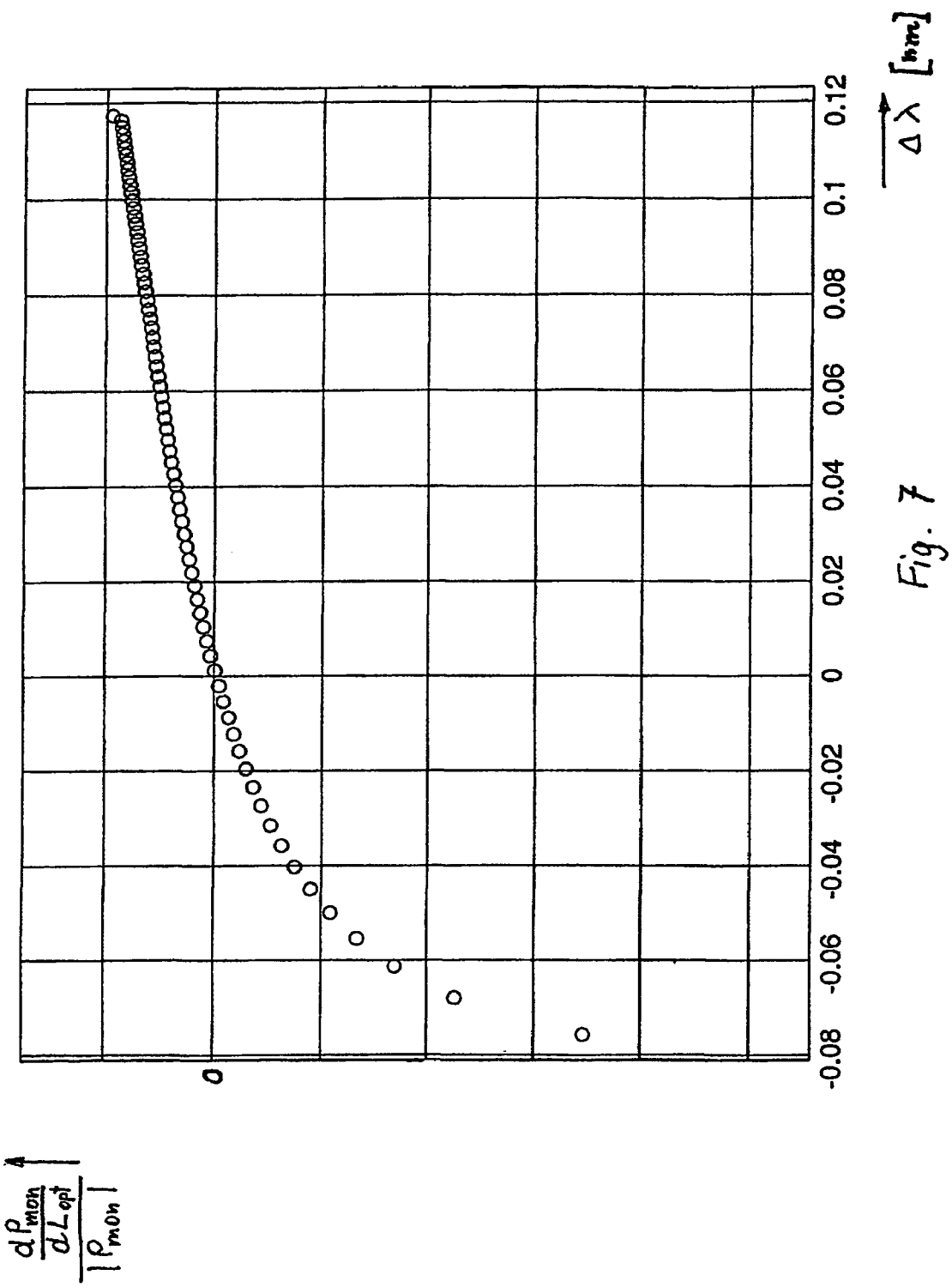

As a solution to this problem, the slope referred to the absolute value of the monitor power $P_{mon}$ is used for control purposes instead of the slope. As can be seen in FIG. 7, this functional dependency in the range of interest I exhibits an almost linear curve with an acceptable slope and thus sufficient changes in order to be able to use this quantity practically for carrying out the control of the operating point.

It should be noted here that the scales of the ordinates in FIGS. 5 and 6 have an arbitrary size and the curves as shown are intended solely to illustrate the principle explained above.

The invention claimed is:

1. A method for controlling the center wavelength of a laser that has a wavelength-selective, partially reflective optical element and is operated in a single-mode manner, comprising the acts of:
   modifying a control quantity influencing the optical resonator length of the laser over a predetermined range;
   detecting a curve of at least one of:
      an optical monitor power that is influenced by modification of the control quantity and is emitted through the side facing away from the optical output of the laser; and
      a detection quantity dependent on the optical monitor power; and
   adjusting the control quantity in response to the act of detecting, the adjusting being based on an averaging function of the curve.

2. The method of claim 1, wherein the control quantity is adjusted such that, at a point within the range for the control quantity, a predetermined value for the slope of the curve of the optical monitor power is reached.

3. The method of claim 1, wherein the control quantity is adjusted such that, at a point within the range for the control quantity, a predetermined value for the slope of the curve of the detection quantity is obtained.

4. The method of claim 1, wherein the control quantity is adjusted such that a predetermined value of a functional dependency $(F(dP_{mon}/dL_{opt}))$ is reached, wherein:
   $P_{mon}$ represents the optical monitor power;
   $L_{opt}$ represents the optical resonator length; and
   the predetermined value of the functional dependency contains the slope of the curve of the optical monitor power or of the curve of the detection quantity.

5. The method of claim 4, wherein the functional dependency $(F(dP_{mon}/dL_{opt}))=(dP_{mon}/dL_{opt})/|P_{mon}|$.

6. The method of claim 1, wherein the detection quantity comprises an output signal of a monitor diode.

7. The method of claim 1, wherein the control quantity comprises a triggering signal of a heating or cooling device for changing the temperature of a subrange of the optical path of a resonator of the laser.

8. The method of claim 1, wherein the control quantity comprises a triggering signal for modifying an axial position of a partially reflective, wavelength-selective, optical element.

9. The method of claim 1, wherein the control quantity comprises a triggering signal for changing mechanical tension conditions within at least a subrange of the laser.

10. The method of claim 1, wherein the control quantity is modified periodically, a width of the predetermined range being selected so that a change of the center wavelength of the optical output power of the laser for each value of the control quantity lies in the predetermined range within specified boundaries.

11. The method of claim 10, wherein, after each pass through the predetermined range for the control quantity, the slope of the curve is determined at a point substantially in a center of the predetermined range for the control quantity.

12. The method of claim 10, wherein, after each pass through the predetermined range for the control quantity, an average slope of the curve is determined in either a subrange of the predetermined range or in the entire predetermined range for the control quantity.

13. The method of claim 1, wherein modifying the control quantity is performed such that a spectral component thereby generated in the entire spectrum of the optical monitor power lies outside a frequency range of an optical data signal with which the laser is driven.

14. The method of claim 1, wherein the width of the predetermined range for the control quantity is selected so that, for a pass through the predetermined range, a change in the optical data output power lies within predetermined boundaries.

15. A device for controlling the center wavelength of a laser that has a wavelength-selective, partially reflective optical element and is operated in a single-mode manner, comprising:
   a controllable device for changing an optical resonator length of the laser;
   a device for detecting a curve of at least one of:
      an optical monitor power emitted through a side facing away from an optical output of the laser; and
      a detection quantity dependent on the optical monitor power; and
   an evaluation and control unit that:
      receives a detection signal corresponding to the curve;
      generates a control signal based on an averaging function of the curve to change the optical resonator length; and
      feeds the control signal to the controllable device.

16. The device of claim 15, further comprising a monitor diode that sends the detection signal to the evaluation and control unit.

17. The device of claim 15, wherein the controllable device comprises one of a controllable heating device and a controllable cooling device.

18. The device of claim 15, further comprising one of a lowpass filter and a bandpass filter that is adapted to allow a frequency band of the control signal to pass.

19. The device of claim 15, further comprising one of a heating device and a cooling device for maintaining a substantially constant temperature of the optical element.

20. The device of claim 15, further comprising a device for controlling an operating point of the laser that receives the detection signal that has been passed through a lowpass filter adapted to pass substantially only a constant component of the detection signal.

* * * * *

UNITED STATES PATENT AND TRADEMARK OFFICE
CERTIFICATE OF CORRECTION

PATENT NO. : 7,356,055 B2  Page 1 of 1
APPLICATION NO. : 10/473942
DATED : April 8, 2008
INVENTOR(S) : Bernd Hubner It is certified that error appears in the above-identified patent and that said Letters Patent is hereby corrected as shown below:

Column 1
Line 38, change "diode" to --diode,--
Line 39, change "diode changing" to --diode, changes--

Column 5
Line 16, after "element", add "3"
Line 19, change "3 or rather" to --3, or rather--
Line 21, change "29 can thus" to --29, can thus--
Line 22, after "resonator", add "27"
Line 24, after "resonator", add "27"
Line 26, after "resonator", add "27"
Line 32, change "unit. In this manner," to --unit 5. In this manner,--

Signed and Sealed this

Twentieth Day of July, 2010

David J. Kappos
*Director of the United States Patent and Trademark Office*